United States Patent
Sung et al.

(10) Patent No.: US 6,380,035 B1
(45) Date of Patent: Apr. 30, 2002

(54) POLY TIP FORMATION AND SELF-ALIGN SOURCE PROCESS FOR SPLIT-GATE FLASH CELL

(75) Inventors: Hung-Cheng Sung, Hsin-chu; Di-Son Kuo, Hsinchu; Chia-Ta Hsieh, Tainan; Yai-Fen Lin, Tai chung, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 12 days.

(21) Appl. No.: 09/713,806

(22) Filed: Nov. 16, 2000

Related U.S. Application Data

(62) Division of application No. 09/086,008, filed on May 27, 1998, now Pat. No. 6,259,131.

(51) Int. Cl.[7] .................. H01L 21/336; H01L 21/3205; H01L 21/4763
(52) U.S. Cl. .................. 438/264; 438/265; 438/593; 438/594
(58) Field of Search ................. 438/264, 265, 438/593, 594

(56) References Cited

U.S. PATENT DOCUMENTS

| | | | |
|---|---|---|---|
| 5,045,488 A | 9/1991 | Yeh | 437/43 |
| 5,095,344 A | 3/1992 | Harari | 357/23.5 |
| 5,198,380 A * | 3/1993 | Harari | 437/43 |
| 5,208,175 A * | 5/1993 | Choi et al. | 437/43 |
| 5,262,655 A | 11/1993 | Ashida | 257/66 |
| 5,268,318 A * | 12/1993 | Harari | 437/43 |
| 5,268,319 A * | 12/1993 | Harari | 437/43 |
| 5,270,240 A | 12/1993 | Lee | 437/52 |
| 5,342,801 A * | 8/1994 | Pery et al. | 437/52 |
| 5,408,136 A | 4/1995 | Woo et al. | 257/758 |
| 5,455,792 A | 10/1995 | Yi | 365/185.12 |
| 5,554,553 A * | 9/1996 | Harari | 437/43 |
| 5,554,564 A | 9/1996 | Nishioka et al. | 437/192 |
| 5,572,054 A | 11/1996 | Wang et al. | 257/322 |
| 5,714,412 A | 2/1998 | Liang et al. | 438/266 |
| 5,897,353 A * | 4/1999 | Kim et al. | 438/261 |

OTHER PUBLICATIONS

"Silicon Processing For The VLSI Era"—vol. 2, By Wolf, Lattice Press, Sunset Beach CA, 1990, p 632–635.

* cited by examiner

*Primary Examiner*—Olik Chaudhuri
*Assistant Examiner*—Shrinivas H. Rao
(74) *Attorney, Agent, or Firm*—George O. Saile; Stephen B. Ackerman; Sevgin Oktay

(57) ABSTRACT

A novel method of forming a polysilicon gate tip (poly tip) for enhanced F-N tunneling in split-gate flash memory cells is disclosed. The poly tip is further enhanced by forming a notched nitride layer over the tip. At the same time, a method of forming a self-aligned source (SAS) line is disclosed. A relatively thin polygate is formed so as to decrease the growth of the protrusion of conventional gate bird's beak (GBB) to a smaller and sharper tip. It will be known by those skilled in the art that GBB is easily damaged during conventional poly etching where polyoxide is used as a hard mask. To use polyoxide as a hard mask, thick polysilicon is needed in the first place. Such thick poly will increase gate coupling ratio, which has the attendant effect of degrading program and erasing performance of the memory cell. Furthermore, as the cell size is being scaled down, poly oxidation is getting, to be a difficult process due to oxide thinning effect, unless a protective measure is undertaken as disclosed in this invention. Finally, with the disclosed smaller poly tip of this invention in comparison with the GBB of prior art, the smaller is the encroachment under the polysilicon edge, and hence the smaller is the impact on the electric-field intensity between the corner edge of the floating gate and the control gate of the completed cell structure, and thus faster is the memory speed.

32 Claims, 9 Drawing Sheets

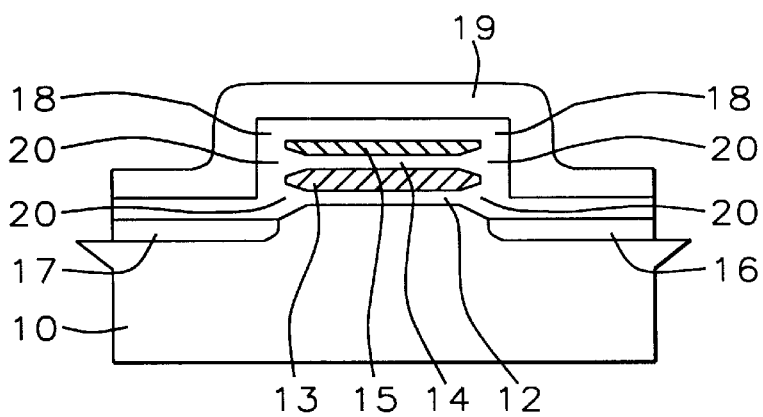
FIG. 1a – Prior Art
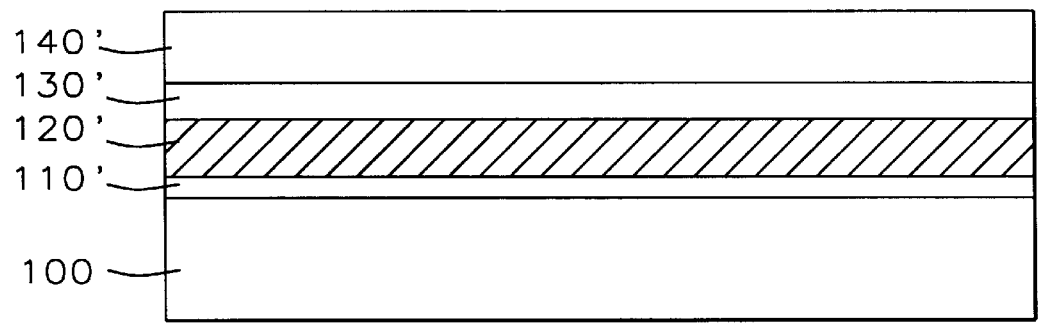
FIG. 2a
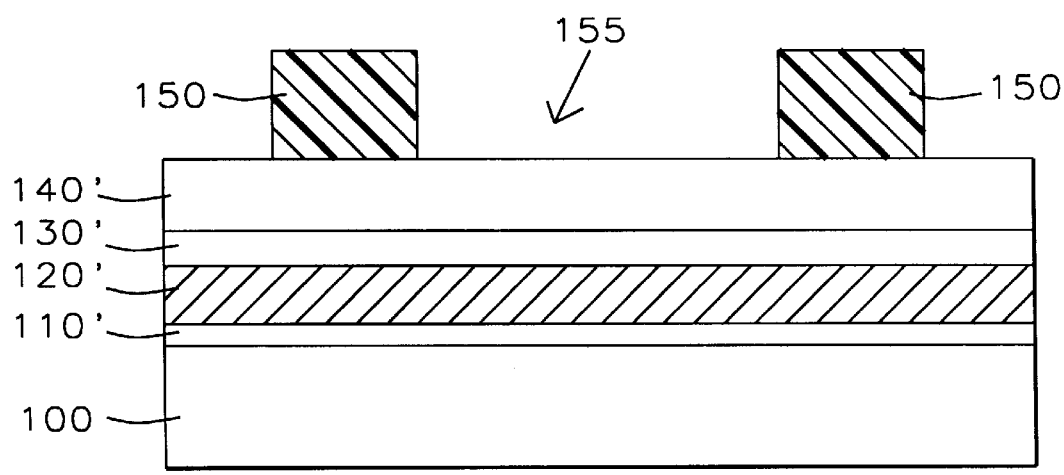
FIG. 2b

POLY TIP FORMATION AND SELF-ALIGN SOURCE PROCESS FOR SPLIT-GATE FLASH CELL

This is a division of patent application Ser. No. 09/086,008, filing date May 27, 1998 now U.S. Pat. No. 6,259,131, Novel Poly Tip Formation And Self-Align Source Process For Split-Gate Flash Cell, assigned to the same assignee as the present invention.

BACKGROUND OF THE INVENTION (1) Field of the Invention

The present invention relates to split-gate memory cells used in flash EEPROMs (Electrically Erasable Programmable Read Only Memories), and in particular, to a method of forming a novel poly tip and a self-aligned source in a split-gate flash cell.

(2) Description of the Related Art

Programming and erasing of an EEPROM cell is accomplished electrically by using Fowler-Nordheim (F-N) tunneling as is well known in prior art. F-N tunneling, in turn, is enhanced usually by providing, what is known as a gate bird's beak (GBB) at the corner of a gate structure of the memory cell. However, the forming of a GBB must be optimized carefully, for, otherwise, the GBB can encroach under the gate edge and degrade the programmability of submicron memory cells. That is, the dimensions and shape of the GBB, which is described below more in detail in relation to nonvolatile memories, play an important role in transferring current to and fro between the substrate and the floating gate, and hence the charging speed of the memory cell, and the amount of surface current leakage that takes place around and near the bird's beak. It is disclosed later in the embodiments of the present invention a novel approach to form a polysilicon gate tip (poly tip) in place of gate bird's beak for enhanced F-N tunneling.

Among the nonvolatile read only memories, such as masked-ROMs, Electrically Programmable (EP-ROMs), EEPROMs have been known as one type of nonvolatile memory semiconductor devices capable of electrically writing and erasing information. However, EEPROMs require two transistors to operate. In Flash EEPROM, the memory cell includes one transistor, and the contents of all the memory's cells can be erased simultaneously through the use of an electrical erase signal. Hence, with Flash memory, in addition to gaining speed in having the cells erased much more rapidly, higher levels of integration can be achieved with fewer devices.

The unit cell of an EEPROM memory device is usually comprised of a silicon substrate provided with a source and a drain, and two polysilicon gates; that is, a MOS transistor having a channel defined by the source and drain regions, a floating gate to which there is no direct electrical connection and a control gate with a direct electrical connection. The floating gate is separated from the substrate by an insulating layer of, for example, silicon oxide. The control gate is generally positioned over the floating gate with a layer of insulating material separating the two gates. To program a transistor, electron is injected from the substrate through the insulator and is stored on the floating gate of the transistor. The amount of charge is set to one of two levels to indicate whether the cell has been programmed "on" or "off." "Reading" of the cell's state is accomplished by applying appropriate voltages to the cell source and drain, and to the control gate, and then sensing the amount of charge on the floating gate. To erase the contents of a cell, the programming process is reversed, namely, electrons are removed from the floating gate by transferring them to the control gate through the insulator. A fairly recent technology is "flash" memories in which the entire array of memory cells, or a significant subset thereof, is erased simultaneously. Flash EEPROMs combine the advantages of UV-erasable EPROMS and floating-gate EEPROMs. They offer high density, small cell size, the well-known hot-electron writeability of EPROMs, together with the easy reusability, on-board reprogrammability, and electron-tunneling erasure feature of EEPROMs (See S. Wolf, "Silicon Processing for the VLSI Era," vol. 2, Lattice Press, Sunset Beach, Calif., 1990, pp. 632–634.)

As stated earlier, programming and erasing of an EEPROM is accomplished electrically and in-circuit by using Fowler-Nordheim tunneling. Basically, a sufficiently high voltage is applied to the control gate and drain while the source is grounded to create a flow of electrons in the channel region in the substrate. Some of these electrons gain enough energy to transfer from the substrate to the floating gate through the thin oxide layer by means of Fowler-Nordheim tunneling. The tunneling is achieved by raising the voltage level on the control gate to a sufficiently high value of about 12 volts. As the electronic charge builds up on the floating gate, the electric field is reduced, which reduces the electron flow. When, finally, the high voltage is removed, the floating gate remains charged to a value larger than the threshold voltage of a logic high that would turn it on. Thus, even when a logic high is applied to the control gate, the EEPROM remains off. Since tunneling process is reversible, the floating gate can be erased by grounding the control gate and raising the drain voltage, thereby causing the stored charge on the floating gate to flow back to the substrate. Of critical importance in the tunneling region is the quality and the thinness of the tunneling oxide separating the floating gate from the substrate. Usually a thickness of between about 80 to 120 Angstroms is required to facilitate Fowler-Nordheim tunneling.

A cross section of a conventional Flash EEPROM is shown in FIG. 1. Drain impurity diffusion layer (16) and a source impurity diffusion layer (17) are formed on a main surface of the semiconductor substrate (10) and are spaced from each other by a predetermined distance with a channel region therebetween. The conventional Flash EEPROM further includes a floating gate electrode (13) formed on the channel region with a first gate oxide film (12) therebetween, a control gate electrode (15) formed on the floating gate electrode (13) with an insulating: film (14) therebetween, an interlayer thermal oxide film (18) covering the semiconductor substrate (10), floating gate electrode (13) and control gate electrode (15), and an interlayer insulating film (19) covering the interlayer thermal oxide film (18). Gate bird's beak oxide films (20) are formed at opposite ends of the first gate oxide film (12) and opposite end of the insulating film (14). The interlayer insulating film (19) contains impurity such as boron or phosphorous. The purpose of the interlayer thermal oxide film (18) is to prevent the movement of impurity such as boron or phosphorous of the interlayer insulating film (19) into the semiconductor substrate (10), control gate electrode (15) or floating gate electrode (13) and thus to prevent change of the electrical characteristics thereof.

After the final step of forming the interlayer insulating film (19) to cover the interlayer thermal oxide film (18) shown in FIG. 1, usually heat treatment by a reflow method is carried out to flatten the interlayer insulating film (19). During this process as well as during thermally growing the thermal oxide layer (18) by means of wet oxidation, oxidizer (H₂O) penetrates the interlayer insulating film (19) and interlayer thermal oxide film (18). This causes further oxidization between the semiconductor substrate (10) and the ends of the floating gate electrode (13), and between the control gate electrode (15) and the floating gate electrode (13). As a result, the gate bird's beak oxide films (20) are formed. Consequently, the lower end of the floating gate electrode (13) contacts the gate bird's beak oxide films (20) so that the lower end of the floating gate electrode (13) is oxidized to a large extent as compared with the other portions.

The gate bird's beak oxide film (20) can form either at the lower end of the floating gate (13) and the source impurity diffusion layer (17), or at the lower end of the floating gate near the drain impurity diffusion layer (16), or at both locations. In these cases, the conventional "beak" of the bird's beak is usually long and elongated, thus increasing the size of the cell and at the same time providing paths for current leakage and, therefore, low memory speed.

It is proposed in this invention a method of oxidizing a relatively thin polygate so as to decrease the growth of the protrusion of conventional gate bird's beak (GBB) to a smaller and sharper tip shown by reference numerals (129) in FIGS. 2d–2i and 3j–3l of this invention. It will be known by those skilled in the art that GBB is easily damaged during conventional poly etching where polyoxide is used as a hard mask. To use polyoxide as a hard mask, thick polysilicon is needed in the first place. Such thick poly will increase gate coupling ratio, which has the attendant effect of degrading program and erasing performance of the memory cell. Furthermore, as the cell size is being scaled down, poly oxidation is getting to be a difficult process due to oxide thinning effect, unless a protective measure is undertaken as disclosed in this invention. Finally, with the disclosed smaller poly tip of this invention in comparison with the GBB of prior art, the smaller is the encroachment under the polysilicon edge, and hence the smaller is the impact on the electric-field intensity between the corner edge of the floating gate and the control gate of the completed cell structure, and thus faster is the memory speed. (See S. Wolf and R. N. Tauber, "Silicon Processing for the VLSI. Era," vol. 2, Lattice Press, Sunset Beach, Calif., 1990, p. 438). It will also be appreciated that the smaller the bird's beak, the smaller is the overall size of the memory cell contributing to the increased speed of the memory.

An aspect of forming memory cells is the process by which self-aligned conductive lines can be fabricated. Lee, in U.S. Pat. No. 5,270,240 discloses a four poly EPROM process and structure comprising a conductive source line structure and self-aligned polycrystalline silicon digit lines. A different method is disclosed in the present invention where the process is much less complicated without the need for several layers of poly. A relatively new method of forming a multi-level, split-gate, flash memory cell is disclosed by Liang, et al., in U.S. Pat. No. 5,714,412. In this approach, there are source/drain regions in the substrate self-aligned with the control gate electrode, but having two separated floating gate electrodes. Another method of manufacturing a flash EEPROM devices is taught by Yi in U.S. Pat. No. 5,455,792 employing mid-channel injection. Manufacturing and a method of operating a single transistor non-volatile, electrically alterable semiconductor memory device are disclosed, respectively, by Yeh in U.S. Pat. No. 5,045,488 and by Wang in U.S. Pat. No. 5,572,054. Harari shows how a particular arrangement of elements and cooperative processes of manufacturing can provide self-alignment of elements in U.S. Pat. No. 5,095,344. Ashida of U.S. Pat. No. 5,262,655 shows a method of forming an SRAM having a thermal oxide spacer that round the top of the polygate, rather than sharpening it. Nishioka, et al., of U.S. Pat. No. 5,554,564, on the other hand, show a method for making a DRAM capacitor by pre-oxidizing ply electrode sidewalls, but with the attendant effect of sidewall expansion. Woo, et al, describe an interconnect structure in U.S. Pat. No. 5,408,130 where they use indented sidewalls spacers formed by a wet etch process.

The present invention discloses a split-gate flash memory cell and the forming thereof where a sharp ploy tip, enhanced by a nitride notch and a self-aligned source line provides enhanced memory performance as well as enhanced cell structure.

SUMMARY OF THE INVENTION

It is therefore an object of this invention to provide a novel method of forming a polysilicon gate tip (poly tip) for enhanced F-N tunneling in a split-gate flash memory cell.

It is another object of this invention to provide a method of forming a self-aligned source line in a split-gate flash memory cell.

It is still another object of this Invention to provide a split-gate memory cell with a novel polygate tip (poly tip) further having a nitride notch over it for enhanced F-N tunneling.

These objects are accomplished by providing a semiconductor substrate having active and passive regions defined; forming a gate oxide layer over said substrate; forming a first polysilicon layer over said gate oxide layer; forming a first nitride layer over said first polysilicon layer (poly-1); forming a shallow trench ST-photomask over said first nitride layer; forming said shallow trench in said substrate by etching said first nitride layer, first polysilicon layer, gate oxide layer and said substrate; removing said ST-photomask; depositing a first oxide layer over said substrate including said shallow trench; performing chemical mechanical polishing of said first oxide layer; removing said first nitride layer; depositing a second nitride layer; forming a second oxide layer over said second nitride layer; forming a poly-1 photomask over said second.oxide layer; forming openings in underlying said second oxide layer, said second nitride layer and first polysilicon layer through patterns in said poly-1 photomask to form a floating gate structure; forming a self-aligned source SAS-photomask over said poly-1 mask; etching through said SAS-mask; removing said SAS mask; oxidizing side-walls of said floating gate structure and forming a poly tip in said floating gate structure; partial etching said second nitride layer forming a notch over said poly tip; forming a hot temperature oxide (HTO) layer over said substrate including said floating gate structure; forming a second polysilicon layer. (poly-2) over said HTO layer; forming a poly-2 photomask over said second polysilicon layer; etching and patterning said second polysilicon layer through said poly-2 photomask to form a control gate; performing ion implantation through said patterning in said second poysilicon layer to form source regions in said substrate; removing said poly-2 mask; forming a conformal oxide layer over said substrate; forming oxide spacers; performing ion implantation to form drain regions in said substrate; forming interlevel dielectric layer over said substrate; forming contact holes in said interlevel dielectric layer; forming metal in said contact holes; and etching back excess metal over said substrate.in preparation for performing the remaining process steps in the manufacture of said flash split-gate memory device.

These objects are accomplished further by providing a split-gate flash memory cell comprising providing a semiconductor substrate having active and passive regions defined; shallow trench isolation; a floating gate structure further comprising a first polysilicon layer, a silicon nitride layer and an oxide layer; said floating gate structure having oxidized side-walls, a poly tip and a partially etched nitride notch thereover; said floating gate structure covered with a hot temperature oxide (HTO) layer; a control gate; oxide spacers; a self-aligned source line; source and drain regions; and a metal plug in a contact hole contacting said source region.

BRIEF DESCRIPTION OF THE DRAWINGS

FIG. 1a is a partial cross-sectional view of a Flash EEPROM of prior art.

FIG. 2a is a partial cross-sectional view of a semiconductor substrate showing the forming of gate oxide, polycrystalline silicon and nitride layers according to this invention.

FIG. 2b is a partial cross-sectional view of the. substrate of FIG. 2a showing the defining of the floating gates of this invention.

DESCRIPTION OF THE PREFERRED EMBODIMENTS

Figure 2C:
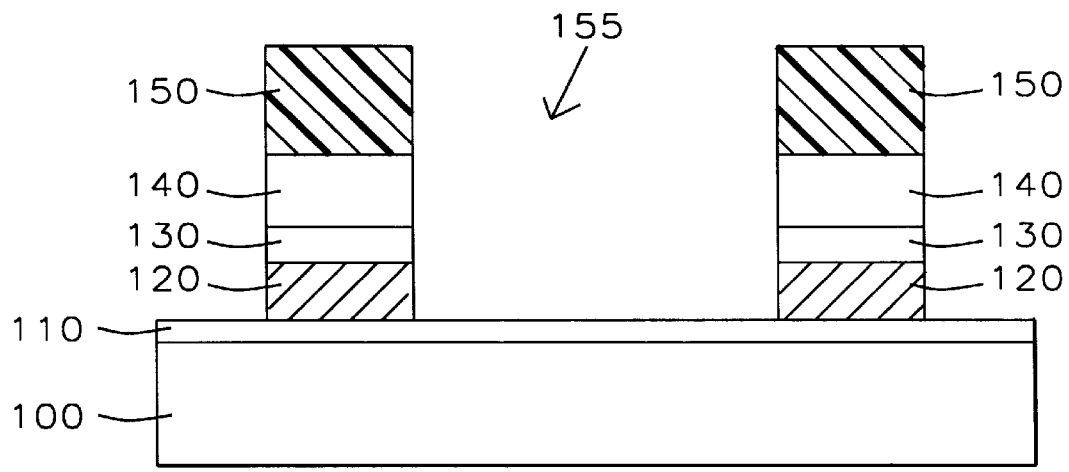
FIG. 2c is a partial cross-sectional view of a semiconductor substrate showing the forming of the composite floating gate structure of this invention.

Referring now to the drawings, in particular to FIGS. 2a–2i, there are shown schematically steps of forming a small and robust polysilicon tip in a split-gate flash memory cell. A second embodiment of a sharper polytip along with a novel method of forming of a self-aligned source are shown in FIGS. 3a–3m. The forming of the improved polytip is accomplished by starting out with a relatively thin polygate—about half the thickness used conventionally.

Thus, in FIG. 2a, semiconductor substrate (100), preferably silicon, is provided with active and passive regions, which are well known in the art. Gate oxide (110') is thermally grown on the substrate at a temperature between about 850 to 900° C., and to a thickness between about 70 to 90 angstroms (Å). A first polycrystalline silicon (polysilicon) layer (120') is deposited over-the gate oxide followed by the deposition of a silicon nitride layer (130') as shown in FIG. 2a. Polysilicon is formed through methods including but not limited to Low Pressure Chemical Vapor Deposition (LPCVD) methods, Chemical Vapor Deposition (CVD) methods and Physical Vapor Deposition (PVD) sputtering methods employing suitable silicon source materials, preferably formed through a LPCVD method employing silane $SiH_4$ as a silicon source material at a temperature range between about 600 to 620° C. Also, the polysilicon is implanted with phosphorous at a dosage level between about $1\times10^{14}$ to $2\times10^{14}$ atoms/cm$^2$ at an energy level between about 20 to 30 KEV. However, it is critical that the polysilicon layer has a thickness between about 800 to 1000 Å, and that the nitride layer is deposited to a thickness between about 300 to 500 Å. Silicon nitride is formed by reacting dichlorosilane ($SiCl_2H_2$) with ammonia ($NH_3$) in an LPCVD at a pressure between about 0.2 to 0.4 torr, temperature between about 800 to 850° C. It will be noted that the polysilicon layer is much thinner than commonly practiced. The two thin layers are then covered by a relatively thick oxide to a thickness between about 500 to 700 Å. Preferably, thick oxide layer (140') is formed by decomposing tetraethyl orthosilicate, or TEOS in a medium temperature LPCVD reactor.

Figure 2D:
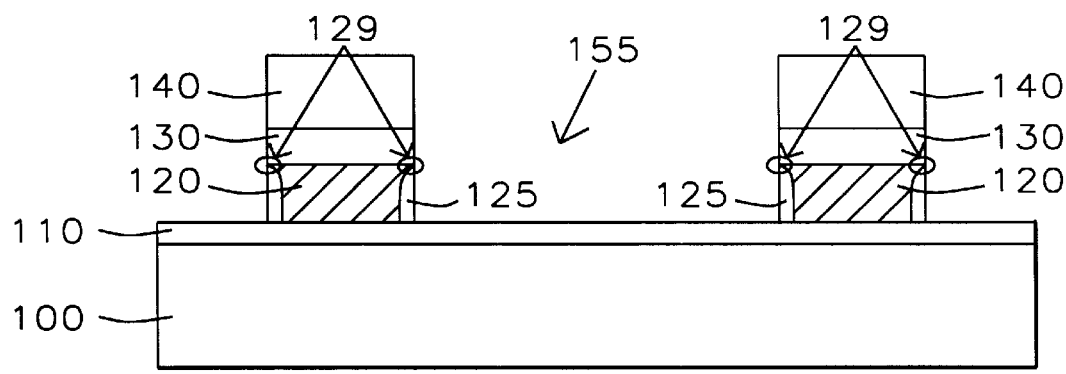
FIG. 2d is a partial cross-sectional view of the substrate of FIG. 2c showing the oxidization of the polysilicon gate and the forming of the polysilicon tip (poly tip) of this invention.
Figure 2E:
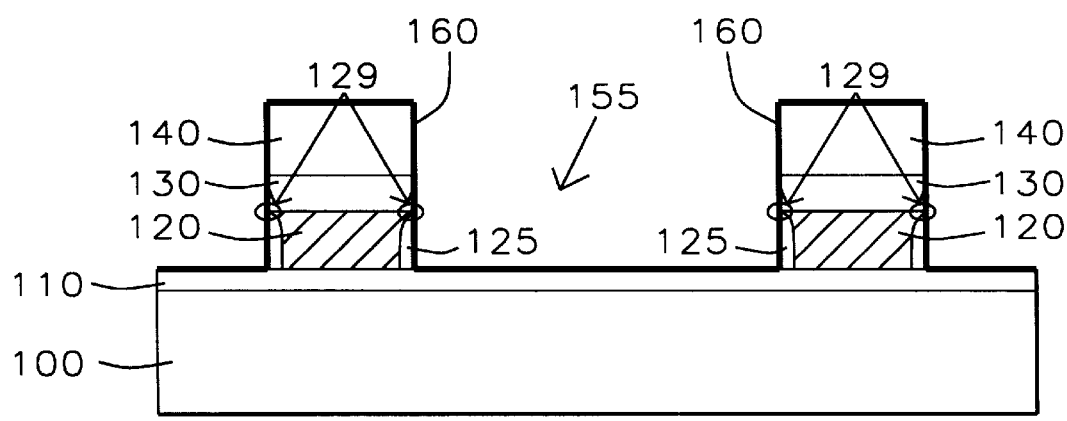
FIG. 2e is a partial cross-sectional view of the substrate of FIG. 2d showing the forming of hot temperature oxide layer over the floating gate structure of this invention.

Next, a photoresist layer (150) is first spun on the substrate and then patterned as shown in FIG. 2b using a mask having floating gate pattern. This is followed by etching the three layers, namely, oxide (140'), nitride (130') and first polysilicon (120') layers through pattern openings (155) in the photoresist layer, thus forming floating gate structures as shown in FIGS. 2c and 2d. First photoresist layer (150) is then removed by employing conventional oxygen plasma ashing process.

As a main feature and key aspect of the present invention, the sidewalls of the floating gate structure shown in FIG. 2d are next wet oxidized at a temperature between about 750 to 850° C. and to a thickness between about 70 to 100 Å. It is important that the oxidation rate of the polysilicon is 2 to 3 times faster than that of silicon. Poly-oxide (125) is formed in such a way that because oxygen cannot diffuse trough nitride, it is very difficult to form an oxide at the silicon/nitride interface. Thus the oxidation of the polysilicon advances in a non-uniform manner with very little at the polysilicon/nitride interface to a larger rate elsewhere so as to form a thin and robust tip (129) while, at the base, assuming a thickness between about 50 to 70 Å as shown in FIG. 2d. The tip is further ruggedized by encasing it, along with the rest of the floating gate structure, with a layer of hot temperature oxide (HTO), though the main purpose of the HTO is to prevent charge leakage from the floating gate to the control gate. It will be obvious to those practicing the art that the HTO, reference numeral (160) in FIGS. 2e–2i, also serves as interpoly oxide between the floating gate and the control gate to be formed at a later step. It is preferred that the HTO has a thickness between about 100 to 130 Å, and that it is formed by an LPCVD process in which dichlorosilane and nitrous oxide are reacted at a high temperature between about 900 to 1000° C.

Figure 2F:
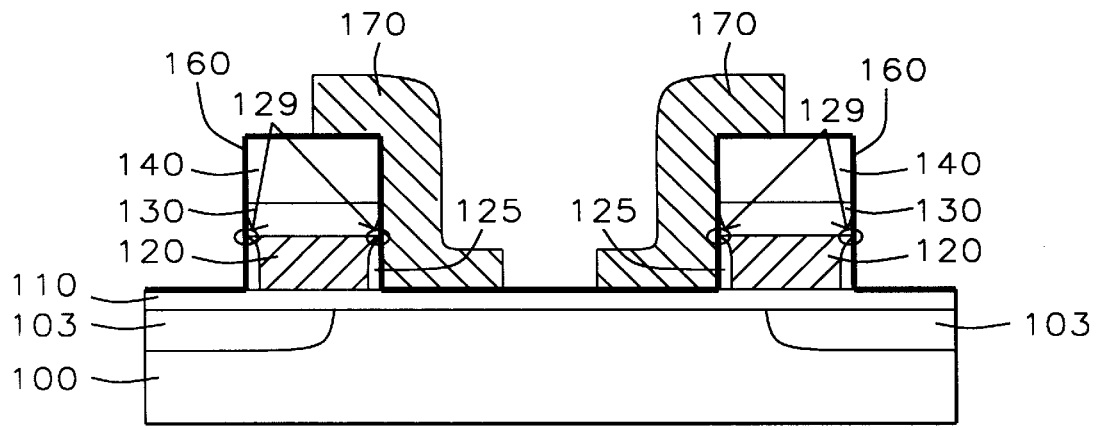
FIG. 2f is a partial cross-sectional view of the substrate of FIG. 2e showing the forming of the control gate of this invention and the source regions of the substrate.

A second polysilicon (poly-2) layer (170) is next deposited over HTO layer (160) and patterned to form a control gate using a second photoresist layer (not shown) and a mask having control gate patterns. Layer (170) shown in FIG. 2f is preferably formed through a LPCVD method employing silane $SiH_4$ as a silicon source material at a temperature range between about 600 to 630° C. and to a thickness between about 1000 to 1500 Å. Preferably poly-2 is doped with phosphorous and that tungsten silicide of thickness between about 900 to 1000 Å is also formed over it. The etching of the second polysilicon layer to form the control gate is accomplished by using a recipe comprising gases $SF_6$/He/HBr at an ambient pressure between about 75 to 85 mTorr, and energy level between about 375 to 425 watts. After the forming of control gate (170), conventional source regions (103) are formed in substrate (100) by implanting phosphorous at a concentration between about $1\times10^{15}$ to $3\times10^{15}$ atoms/cm$^2$, and energy level between about 40 to 60 KEV. A source drive-in of about 70 to 80 Å is accomplished with dry oxygen at a temperature between about 825 to 875° C. and for about 30 minutes.

Figure 2G:
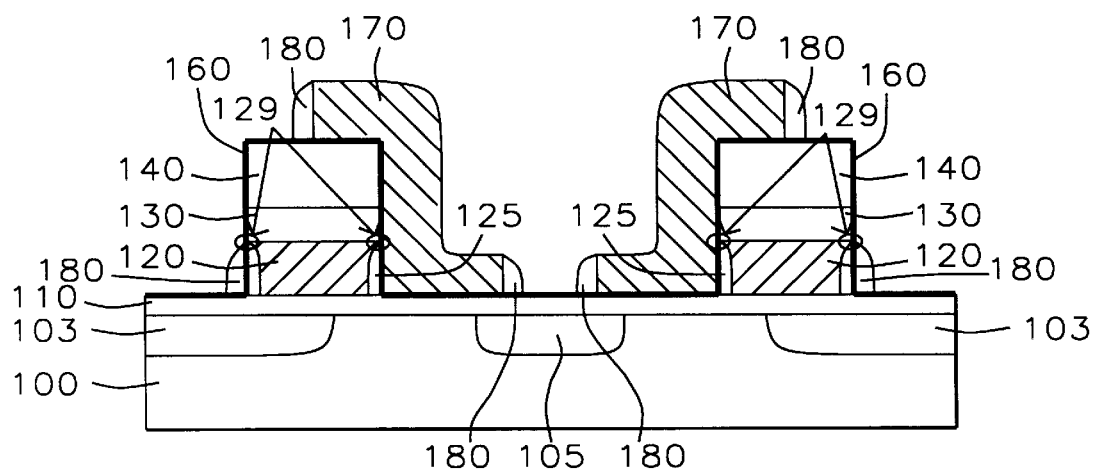
FIG. 2g is a partial cross-sectional view of the substrate of FIG. 2f showing the forming of oxide spacers of this invention and the drain region of the substrate.

Oxide spacers (180) are next formed as shown in FIG. 2g. This is accomplished by depositing an oxide layer (not shown) to a thickness between about 1000 to 1500 Å, and then performing anisotropic etching using a recipe comprising gases $CF_4/CHF_3$/Ar at a pressure between about 775 to 825 mTorr and energy between about 375 to 425 watts. Then, drain regions are defined using a third photoresist layer (not shown), and formed by implanting arsenic at a concentration between about $1\times10^{15}$ to $5\times10^{15}$ atoms/cm$^2$, and energy level between about 40 to 60 KEV.

Figure 2H:
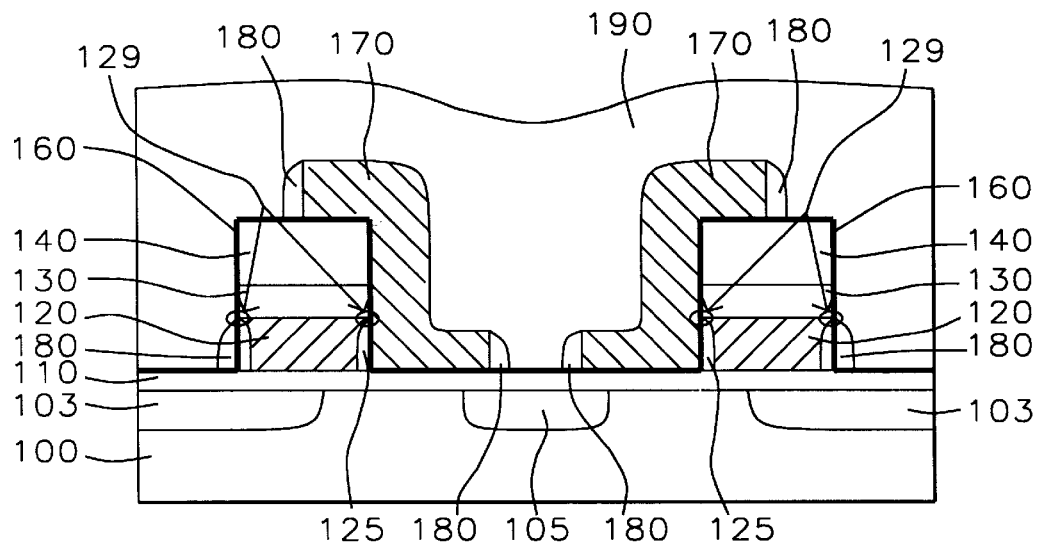
FIG. 2h is a partial cross-sectional view of the substrate of FIG. 2g showing the forming of the interlevel dielectric of this invention.
Figure 2I:
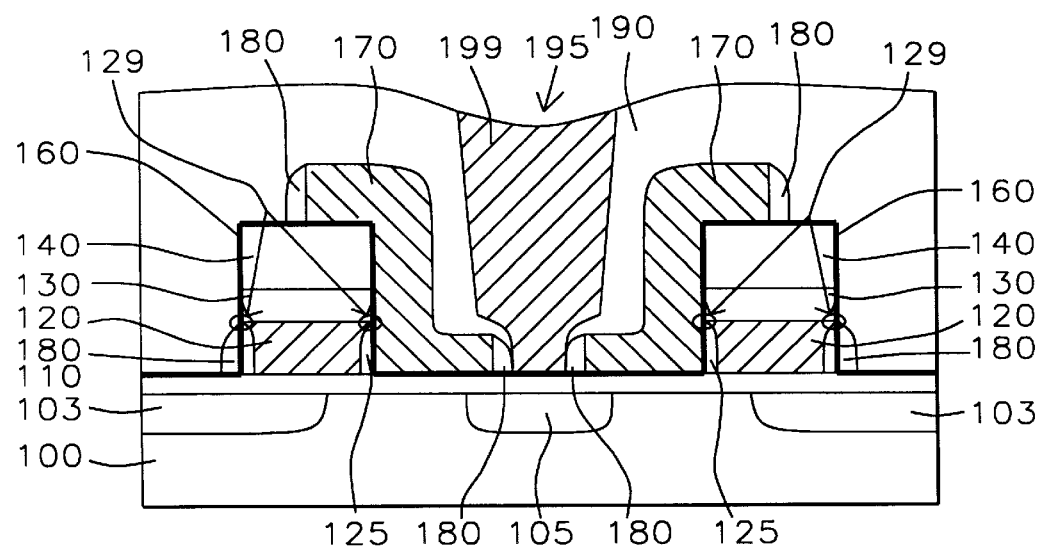
FIG. 2i is a partial cross-sectional view of the substrate of FIG. 2h showing the forming of the contact hole and the metal plug in the hole of the split-gate flash memory cell of this invention with a poly tip.

Subsequently, interlevel dielectric (ILD) layer (190) is formed over the substrate as shown in FIG. 2h, using conventional techniques. Blanket dielectric layers may be formed from materials including but not limited to silicon oxide materials, silicon nitride materials, and silicon oxynitrides materials formed within integrated circuits through methods including but not limited do CVD, PECVD, PVD sputtering methods. For the preferred embodiment of the present invention, dielectric layer (190) is preferably formed of a dielectric material chosen from the group of dielectric materials consisting of silicon oxide dielectric materials, silicon nitride, and silicon oxynitride. Preferably, the thickness of layer (190) is between about 1 to 2 micrometers ($\mu$m). The ILD layer is next planarized and photo-etched using conventional techniques to form contact hole (195) to contact the drain region of the substrate as shown in FIG. 2i. Finally, the hole is filled with metal, preferably tungsten, and the excess removed by chemical mechanical polishing to form metal plug (199) in preparation for performing the remaining process steps in the manufacture of the split-gate flash memory device of this invention.

In operation, the relative thinness of the floating gate, (120), and the presence of a thin pointed poly tip, (129), between the floating gate, (120), and the control gate, (170), augments performance. That is, the local electric field is enhanced with the poly tip of polygate so that the erase speed, for example, becomes faster. Some of the operational parameters are given below:

|  | control gate | source | drain | substrate |
|---|---|---|---|---|
| program | 1.5–2.0 V | ≧10 V | 0~0.5 V | 0 |
| erase | ≧11 V | 0 | 0 | 0 |
| read | 3–5 V | 0 | 2–3 V | 0 |

In another embodiment, the polytip is further modified to improve performance. This is accomplished by partially etching nitride layer (130) under oxide layer (140) in FIG. 2d, prior to the deposition of HTO layer (160) in FIG. 2e. This preferred embodiment, shown in FIGS. 3j–3m will now be described in conjunction with the forming of a self-aligned source (SAS) in FIGS. 3a–3m.

Figure 3A:
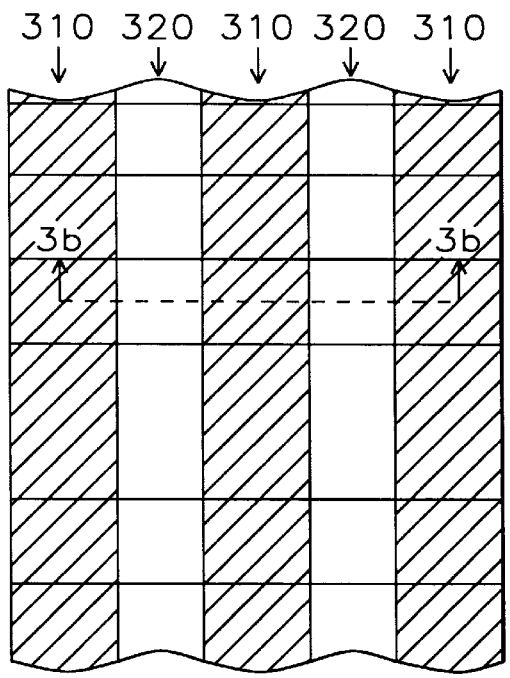
FIG. 3a is a partial top view of a semiconductor substrate showing regions where shallow trench isolation regions and gate regions are to be formed according to this invention.
Figure 3B:
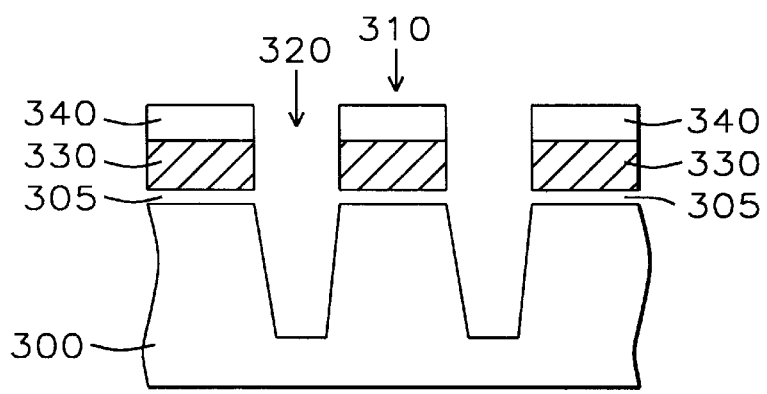
FIG. 3b is a horizontal cross-sectional view of the substrate of FIG. 3a showing the forming of a first polysilicon layer and shallow trench, according to this invention.
Figure 3C:
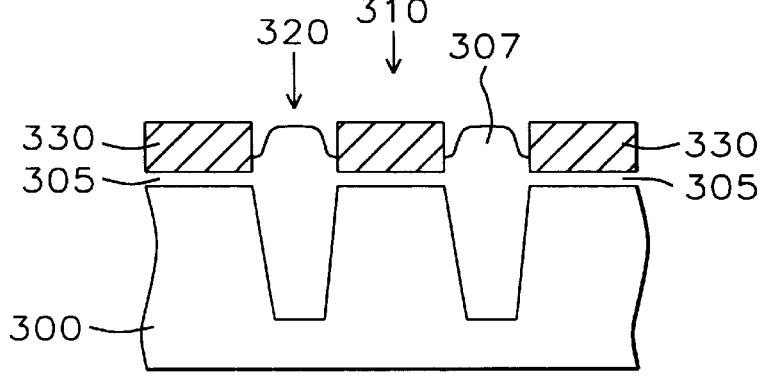
FIG. 3c is a horizontal cross-sectional view of the substrate of FIG. 3a showing the filling of the trench of FIG. 3b with oxide, according to this invention.
Figure 3D:
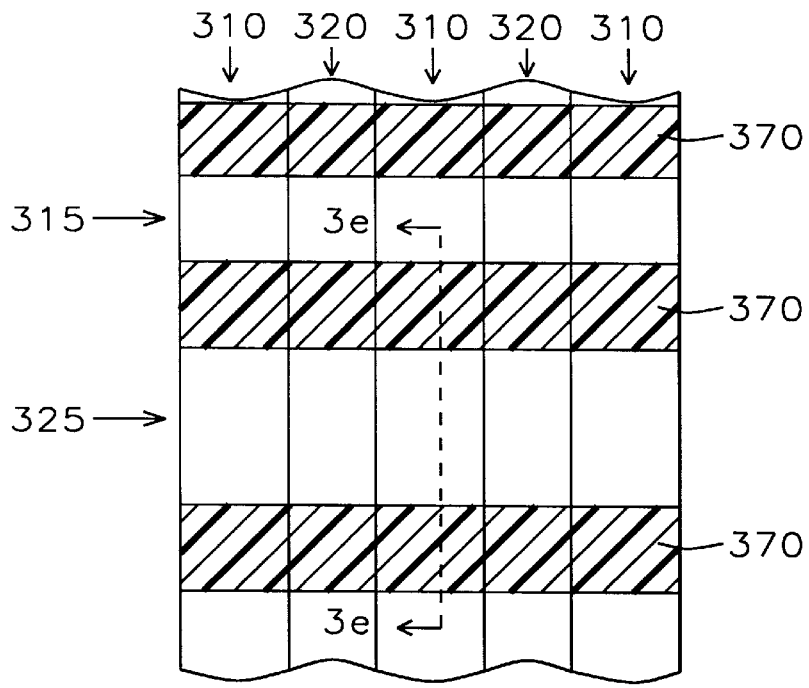
FIG. 3d is a top view of the substrate of FIG. 3a showing the forming of a poly-1 photomask over layers formed covering the first polysilicon layer of FIG. 3a, according to this invention.

FIG. 3a shows a top view of a portion of a silicon substrate provided with active and passive regions as known in the art. The top view shows regions of shallow trench isolation (320), also well known in the art, to be formed, as shown in FIG. 3b, which is a cross-sectional view of substrate (300) taken at 3b—3b. For clarity, the top view also shows regions (310) where first polysilicon layer (poly-1) will be deposited to form the floating gate of the split-gate flash memory cell.

Thus, first, the split-gate flash cell voltage threshold adjust is accomplished by preferably implanting boron at a dosage level between about $3\times10^{12}$ to $3.5\times10^{12}$ atoms/cm$^2$ and energy level between about 50 to 60 KEV. Floating gate oxide (305) is next thermally grown at a temperature between about 850 to 900° C., to a thickness between about 80 to 100 Å. This is followed by the deposition of a first polysilicon layer, poly-1, (330) to a thickness between about 800 to 900 Å, which in turn is covered with a layer of nitride to a thickness between about 1400 to 1600 Å. Using conventional techniques, a photoresist layer is formed (not shown) to define the shallow trench isolation (STI) areas and the defined areas are then etched trough nitride, polysilicon, gate oxide layers and into silicon (300) to form the trenches (310) shown in FIG. 3b. It is preferred the depth of the trench is between about 3300 to 3600 Å. The forming of the STI is completed by removing the photoresist mask, filling the trenches by oxide deposition, performing chemical mechanical polishing including an oxide wet dip. The nitride layer is then removed. It will be noted that poly-1 is left only in regions (310) shown in FIGS. 3a–3c.

Figure 3E:
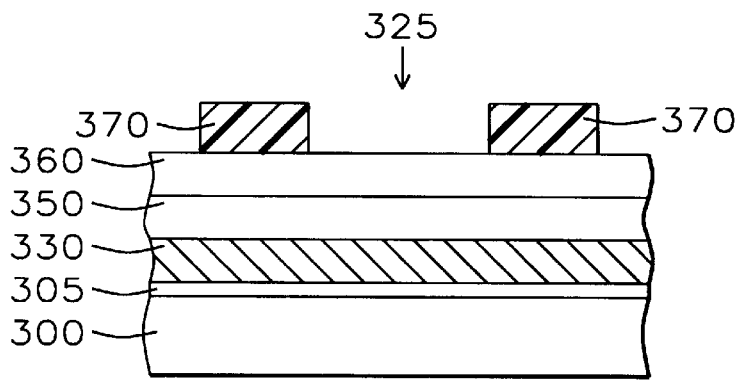
FIG. 3e is a vertical cross-sectional view of the substrate of FIG. 3d showing the various layers formed over the first polysilicon layer, according to this invention.
Figure 3F:
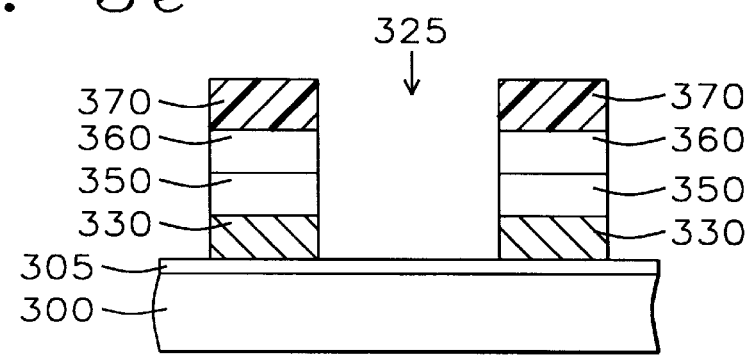
FIG. 3f is a cross-sectional view of the substrate of FIG. 3e showing the forming of a floating gate structure of this invention.

A cross-sectional view, 3e—3e, of substrate (300), perpendicular to the previous view 3b—3b is shown in FIG. 3e after having formed two new layers, namely, silicon nitride layer (350) and a second oxide layer (360). It is preferred that the thicknesses of both the silicon nitride layer and the second oxide layer are between about 450 to 550 Å. FIG. 3e is a cross section along one of the regions (310) where the poly-1 layer remains from a previous process step. Next, a second photoresist layer is formed and patterned to form a poly-1 mask (370) shown in FIG. 3e. Using the gate poly-1 mask, oxide, silicon nitride and first polysilicon are etched until the floating gate oxide layer (305)is reached as shown in FIG. 3f.

Figure 3G:
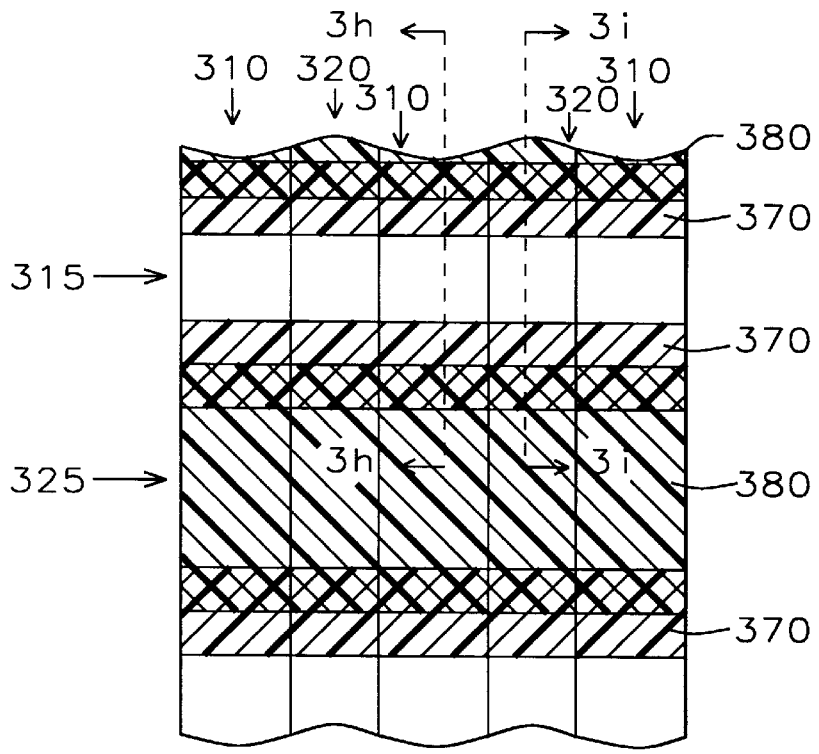
FIG. 3g is atop view of the substrate of FIG. 3a showing the forming of a self-aligned source SAS-mask over the poly-1 mask of FIG. 3f, according to this invention.

Another phtoresist layer is formed and patterned to form a self-aligned source (SAS) mask (380) as shown in FIG. 3g. Cross-sectional views of the substrate taken at 3h—3h, and 3i—3i after the forming of the poly-1 mask and SAS mask are shown in the respective FIGS. 3h and 3i. It will be noted that the cross-section taken at 3h—3h shows the first polysilicon (poly-1) layer (330), while the one taken at 3i—3i along the trench region does not, since poly-1 was etched away from those areas when forming the trenches. Using the SAS mask (380), oxide (307) (See FIG. 3c) in trench (325) is removed. It is preferred that the following etch recipe with a high selectivity to silicon and $Si_3N_4$ is used for this purpose: gases $CF_4/CHF_3/CO/Ar$ at a pressure between about 900 to 1000 mTorr, with an energy level between about 750 to 850 watts. Thus, the shallow trench etch is self-aligned to poly-1 as seen in FIG. 3i and the self-aligned source (SAS) line is also as shown in FIG. 3m.

Figure 3H:
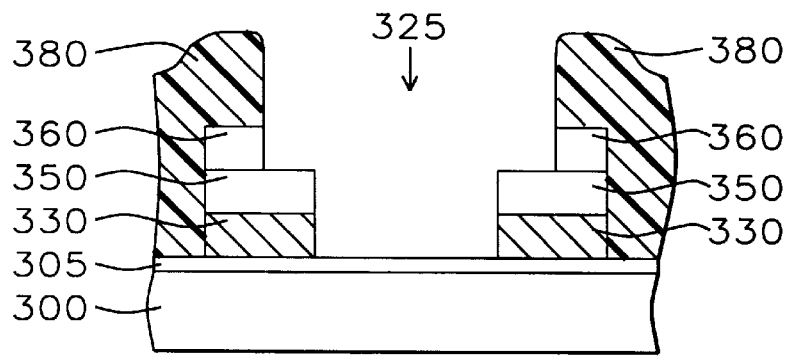
FIG. 3h is a vertical cross-sectional view of the substrate of FIG. 3g showing the forming of the SAS-mask over the poly-1 mask, according to this invention.
Figure 3I:
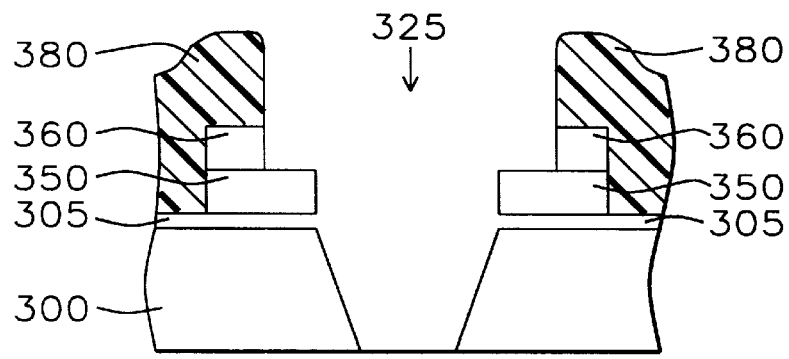
FIG. 3i is a vertical cross-sectional view of the substrate of FIG. 3a showing the removal of oxide from the shallow trench of FIG. 3c, according to this invention.
Figure 3J:
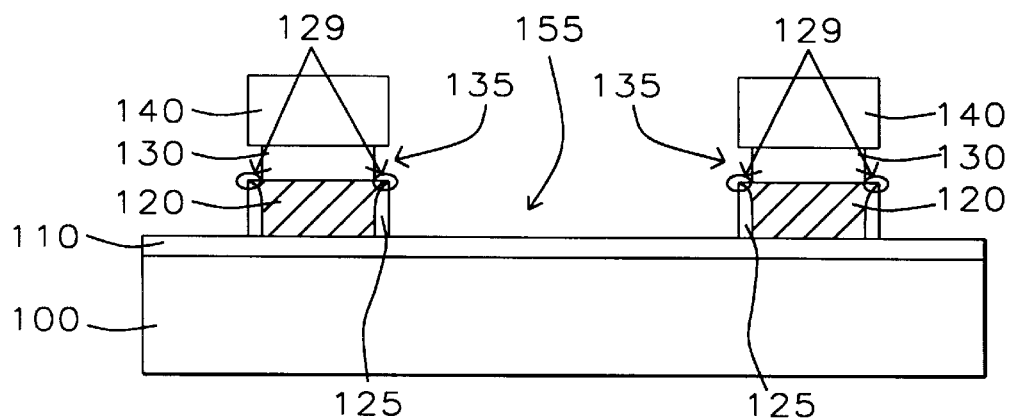
FIG. 3j is a partial cross-sectional view of the substrate of FIG. 3i showing the forming of the nitride notch of this invention after the oxidization of the polysilicon gate and the forming of the polysilicon tip (poly tip) according this invention.

The layered structure shown in FIG. 3h is the same as that of FIG. 2c of the first embodiment. Thus, following the same steps as before in oxidizing the side-wall of poly-1 to form a sharp tip, which is a main feature of the first embodiment, another key feature of the second embodiment is performed by partial etching of the nitride layer (130) which is equivalent to the silicon nitride layer (330), as shown in FIG. 3j. In another words, a notch (135) is formed over the polytip (129). This has the added advantage of presenting even a sharper poly-1 tip (for enhanced electron transfer) towards the second polysilicon, poly-2, that will be deposited to form the control gate. The partial etching of the nitride layer is performed with hydrophosphoric acid, $H_3PO_4$, at a temperature between about 160 to 170° C.

Figure 3K:
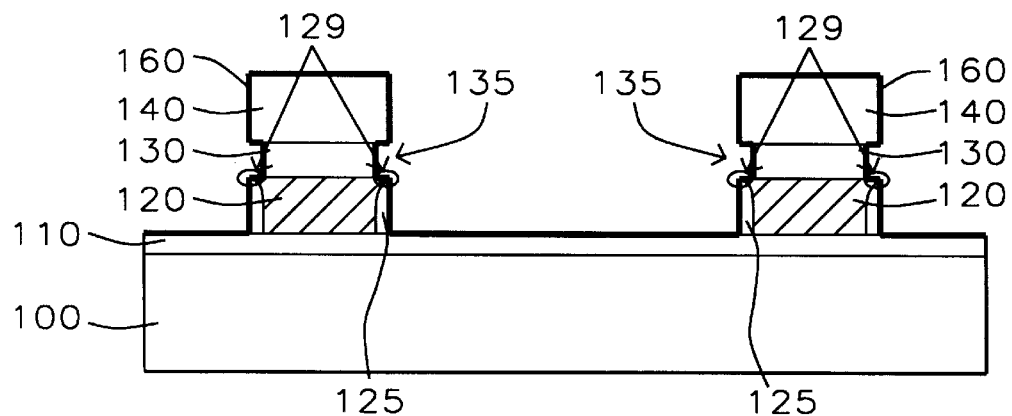
FIG. 3k is a partial cross-sectional view of the substrate of FIG. 3j showing the forming of the high temperature oxide according to this invention.
Figure 3L:
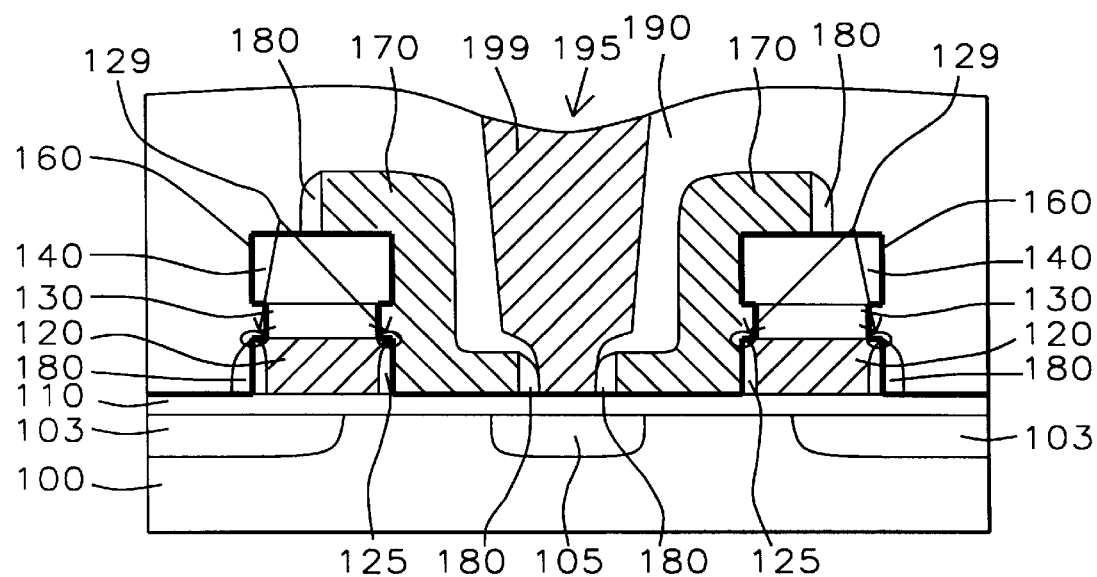
FIG. 3l is a partial cross-sectional view of the substrate of FIG. 3k showing the forming of the contact hole and the metal plug in the hole of the split-gate flash memory cell of this invention having a notch, a poly tip as well as a self-aligned source line.
Figure 3M:
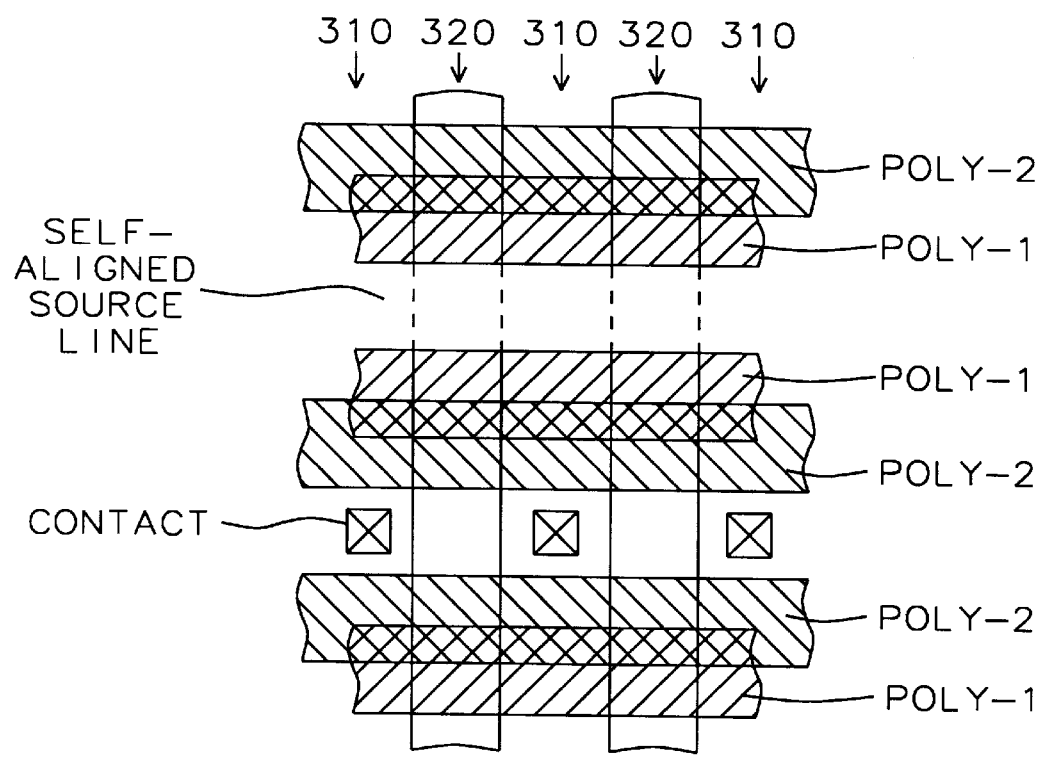
FIG. 3m is a top view of the substrate of FIG. 3l showing the spatial relationship between the control gate, floating gate having a notch and a poly tip, and the self-aligned source line of this invention.

The subsequent steps of forming hot temperature oxide (HTO) layer (160) as shown in FIG. 3k, poly-2 deposition and forming of control gate (170) are the same as in the first embodiment of this invention. Source implanting is performed with phosphorous while source drive is accomplished at a temperature between about 825 to 875° C. for about 30 minutes. For drain implant, arsenic is preferred at a dosage level between about $5\times10^{15}$ to $5.5\times10^{15}$ atoms/cm$^2$ and at an energy level between about 40 to 50 KEV. After the removal of various implant photomasks, an interlevel dielectric layer (190) is formed followed by the formation of contact hole (195) as shown in FIG. 3l. The spatial relationship between the two polysilicon gates, contact hole and the self-aligned source line of this invention are better seen in FIG. 3m.

While the invention has been particularly shown and described with reference to the preferred embodiments thereof, it will be understood by those skilled in the art that various changes in form and details may be made without departing from the spirit and scope of the invention.

What is claimed is:

1. A method of forming a poly tip and a self-aligned source line split-gate flash memory cell comprising the steps of:

providing a semiconductor substrate having active and passive regions defined;

forming a gate oxide layer over said substrate;

forming a first polysilicon layer over said gate oxide layer;

forming a first nitride layer over said first polysilicon layer (poly-1);

forming a shallow trench ST-photomask over said first nitride layer;

forming said shallow trench in said substrate by etching said first nitride layer, first polysilicon layer, gate oxide layer and said substrate;

removing said ST-photomask;

depositing a first oxide layer over said substrate including said shallow trench;

performing chemical mechanical polishing of said first oxide layer;

removing said first nitride layer;

depositing a second nitride layer;

forming a second oxide layer over said second nitride layer;

forming a poly-1 photomask over said second oxide layer;

forming openings in underlying said second oxide layer, said second nitride layer and first polysilicon layer through patterns in said poly-1 photomask to form a floating gate structure;

forming a self-aligned source SAS-photomask over said poly-1 mask;

etching through said SAS-mask;

removing said SAS-mask;

oxidizing side-walls of said floating gate structure and forming a poly tip in said floating gate structure;

partial etching said second nitride layer forming a notch over said poly tip;

forming a hot temperature oxide (HTO) layer over said substrate including said floating gate structure;

forming a second polysilicon layer (poly-2) over said HTO layer;

forming a poly-2 photomask over said second polysilicon layer;

etching and patterning said second polysilicon layer through said poly-2 photomask to form a control gate;

performing ion implantation through said patterning in said second poysilicon layer to form source regions in said substrate;

removing said poly-2 mask;

forming a conformal oxide layer over said substrate;

forming oxide spacers;

performing ion implantation to form drain regions in said substrate;

forming interlevel dielectric layer over said substrate;

forming contact holes in said interlevel dielectric layer;

forming metal in said contact holes; and etching back excess metal over said substrate in preparation for performing the remaining process steps in the manufacture of said flash split-gate memory device.

2. The method of claim 1, wherein said semiconductor substrate is silicon.

3. The method of claim 1, wherein the voltage threshold of said substrate is adjusted by implanting boron at a dosage level between about $3\times10^{12}$ to $3.5\times10^{12}$ atoms/cm$^2$ with energy between about 50 to 60 KEV.

4. The method of claim 1, wherein said gate oxide has a thickness between about 70 to 90 angstroms (Å).

5. The method of claim 1, wherein said first polysilicon layer has a thickness between about 800 to 1000 Å.

6. The method of claim 1, wherein said second nitride layer has a thickness between about 1400 to 1600 Å.

7. The method of claim 1, wherein said ST-photomask is formed by depositing a photoresist layer and patterning it with trench patterns.

8. The method of claim 1, wherein said forming said shallow trench in said substrate is accomplished by using reactive ion etch.

9. The method of claim 1, wherein said shallow trench has a depth between about 3400 to 3600 Å.

10. The method of claim 1, wherein said removing said ST-mask is accomplished by oxygen plasma ashing.

11. The method of claim 1, wherein the first oxide layer has a thickness between about (5000 to 7000) 500–700 Å.

12. The method of claim 1, wherein said chemical mechanical polishing is followed by oxide wet dip.

13. The method of claim 1, wherein said removing said first nitride layer is accomplished by dry etching.

14. The method of claim 1, wherein said second nitride layer is silicon nitride.

15. The method of claim 1, wherein said second nitride layer has a thickness between about 450 to 550 Å.

16. The method of claim 1, wherein said second oxide layer has a thickness between about 450 to 550 Å.

17. The method of claim 1, wherein said forming openings in said underlying layers through patterns in said poly-1 photomask is accomplished by dry etching.

18. The method of claim 1, wherein said forming said SAS-mask is accomplished by depositing a photoresist layer and patterning it corresponding to source regions of said split-gate cell.

19. The method of claim 1, wherein said etching through said SAS-mask removes said first oxide in said shallow trench.

20. The method of claim 1, wherein said removing said SAS-mask is accomplished by oxygen plasma ashing.

21. The method of claim 1, wherein said oxidizing sidewalls of said floating gate structure and forming a poly tip is accomplished by performing wet oxidation at a temperature between about 750 to 850° C.

22. The method of claim 21, wherein said poly tip has a thickness between about 70 to 100 Å.

23. The method of claim 1, wherein said partial etching said second nitride layer forming a notch over said poly tip is accomplished with an etch recipe comprising etchant $H_3PO_4$ at a temperature between about 160 to 170° C.

24. The method of claim 11, wherein the thickness of said HTO layer is between about 95 to 105 Å.

25. The method of claim 1, wherein said second polysilicon layer has a thickness between about 1000 to 1500 Å.

26. The method of claim 1, wherein said forming a poly-2 mask is accomplished by depositing a layer of photoresist and patterning it with patterns corresponding to a control gate of said split-gate flash memory cell.

27. The method of claim 1, wherein said performing ion implantation through said patterning in said second poysilicon layer to form source regions in said substrate is accomplished with gas phosphorous at a dosage level between about $1\times10^{15}$ to $3\times10^{15}$ atoms/cm$^2$ and energy level between about 40 to 60 KEV.

28. The method of claim 1, wherein said conformal oxide layer is oxynitride with a thickness between about 1000 to 1500 Å.

29. The method of claim 1, wherein said forming oxide spacers is accomplished with an anisotropic etch recipe comprising $CF_4$/$CHF_3$/Ar at a pressure between about 775 to 825 mTorr, and energy level between about 375 to 425 watts.

30. The method of claim 1, wherein said performing ion implantation to form drain regions in said substrate is accomplished with gas arsenic at a dosage level between about $1\times10^{15}$ to $5\times10^{15}$ atoms/cm$^2$ and energy level between about 40 to 60 KEV.

31. The method of claim 1, wherein said interlevel dielectric layer has a thickness between about 1.0 to 1.5 micrometers ($\mu$m).

32. The method of claim 1, wherein said forming metal in said contact holes is accomplished by depositing tungsten.

* * * * *